United States Patent [19]

Sawa et al.

[11] Patent Number: 4,958,134

[45] Date of Patent: Sep. 18, 1990

[54] NOISE SUPPRESSION DEVICE COMPRISING A TOROID WINDING

[75] Inventors: Takao Sawa; Masami Okamura; Taiju Yamada; Takao Kusaka, all of Yokohama; Hiroshi Sasaki, Chigasaki, all of Japan

[73] Assignee: Kabushiki Kaisha Toshiba, Kawasaki, Japan

[21] Appl. No.: 238,721

[22] Filed: Aug. 31, 1988

[30] Foreign Application Priority Data

| | | | |
|---|---|---|---|
| Sep. 4, 1987 | [JP] | Japan | 62-220341 |
| Sep. 4, 1987 | [JP] | Japan | 62-220342 |
| Sep. 4, 1987 | [JP] | Japan | 62-220343 |
| Sep. 22, 1987 | [JP] | Japan | 62-236142 |

[51] Int. Cl.[5] .......... H03H 7/01

[52] U.S. Cl. .......... 333/12; 333/185; 336/229

[58] Field of Search .......... 333/12, 181, 185, 167; 336/229, 232

[56] References Cited

U.S. PATENT DOCUMENTS

| | | | |
|---|---|---|---|
| 3,411,111 | 11/1968 | Meyers, Jr. | 333/12 |
| 4,656,451 | 4/1987 | Pomponio | 333/12 X |
| 4,818,957 | 4/1989 | Cort | 333/12 |

OTHER PUBLICATIONS

"Definitions and Designation of Surface Roughness", *Japanese Industrial Standard,* JIS B 0601-1982.

*Primary Examiner*—Eugene R. LaRoche
*Assistant Examiner*—Benny Lee
*Attorney, Agent, or Firm*—Foley & Lardner, Schwartz, Jeffrey, Schwaab, Mack, Blumenthal & Evans

[57] ABSTRACT

A noise suppression device is disclosed which comprises a toroid-shaped device comprising an amorphous magnetic alloy ribbon wound with plural turns, or ring-shaped pieces formed from an amorphous magnetic alloy ribbon and laminated in plural number, and a through-hole through which an electrical line or lead is inserted, and having a value of Do satisfying the relation of $L < Do \leqq 5L$ when an average diameter of said device is Do, provided that the average diameter is an arithmetic mean value of the outer diameter of the device and the diameter of the through-hole, and the largest length at a cross section of said line or said lead, L, is smaller than the diameter of the through-hole.

The noise suppression device according to this invention is improved in heat-dissipation properties with a great decrease in breakage, and has a superior noise suppresion effect.

8 Claims, 4 Drawing Sheets

NOISE SUPPRESSION DEVICE COMPRISING A TOROID WINDING

BACKGROUND OF THE INVENTION

This invention relates to a noise suppression device, and more particularly to a device effective for suppressing generation of noise from a circuit by externally fitting it on a line in semiconductor circuits; such as switching electric source circuits, or other sorts of devices such as rectifiers and capacitors.

Semiconductor circuits, as exemplified by switching electric source circuits, that control a large electric current in a high frequency region have for a long time had the problem that a current spike or ringing tends to be produced owing to the properties of semiconductors themselves or other factors in the circuits. There is a possibility that these phenomena impede normal operation of circuits, finally resulting in destruction of the semiconductors themselves.

Moreover, the above abrupt changes that occurred in circuits during switching operation may generate conduction noise and radiation noise to bring about noise problems in the equipment in which the circuits are incorporated.

In recent years, international demands for taking stronger countermeasures to such noise problems have strongly promoted efforts to prevent generation of noise in the equipment in which semiconductor circuits are incorporated.

As one of such countermeasures, it has been practiced, for example, to externally fit a small inductor, called a ferrite bead, on a lead of the rectifiers to be incorporated in semiconductor circuits. The ferrite bead used here is obtained by molding ferrite powder into a toroidal shape, followed by sintering.

This noise suppression device, however, is affected by the properties inherent in the ferrite itself that constitutes the device so that it has such a small rectangular ratio ($Br/B_1$ where Br is residual flux density and $B_1$ is flux density) and saturated magnetic flux density that it can achieve only a small noise-suppressing effect. It hence becomes necessary to make it larger in order to make effective use thereof. In this device, it may also occur that the self-loss of ferrite at the time of operation brings about such a sudden heat build-up in the inner diameter side of a hollow center through which the lead of rectifiers is inserted that a great temperature difference is produced between it and the outer diameter side. Because of the poor thermal conductivity and heat-dissipation property of the ferrite, this temperature difference may also cause generation of thermal stress in the ferrite bead. Such stress may frequently bring about the situation that the ferrite bead is broken. In other words, the ferrite bead can not endure long-term use.

In addition, in the instance where this ferrite bead is used in combination with an inductor of rectifiers or a capacitor and a inductor, the ferrite, which has a high electrical resistance and a small magnetic shielding effect, can not be said to have a sufficient performance in regard to suppression of conduction noise and radiation noise, and thus can not be satisfactory for practical use in regard to its reliability.

Taking account of these factors, recently developed is a noise suppression device employing a ribbon of an amorphous magnetic alloy.

This device comprises a toroidal core formed by winding an amorphous magnetic alloy ribbon with a given ribbon width to produce a hollow center with a given inner diameter, coating the whole with a resin such as epoxy resin, and thereafter applying the winding of wire with given turns to the part on which the ribbon has been wound, and may include devices commercially available under trade names of, for example, "SPIKE KILLER" (produced by Toshiba Corporation).

The above noise suppression device employing the amorphous magnetic alloy ribbon may suffer less breaking troubles in use, is feasible for long-term use, and is superior in the noise suppression performance, but has the following problems in practical use, that must be solved.

First, it can not be provided by incorporating devices in series in a semiconductor device itself, and, with respect to a printed circuit board prepared after a circuit has been once formed, it also can not be directly incorporated in its circuit, causing the problem that the printed circuit board must be made over. Further, because of its relatively large size in terms of shape and dimension, it has a problem in regard to a need for space saving, and requires a somewhat complicated process in that in its preparation the winding of wire with given turns is applied to the part on which the ribbon has been wound, of the core formed in a toroidal shape, by winding the ribbon.

SUMMARY OF THE INVENTION

An object of this invention is to provide a noise suppression device that is a device in the shape of a toroid, but with no winding of wire on the part on which the ribbon has been wound, and yet, because of its specified shape, is much improved in heat-dissipation properties with a great decrease in the occurrence of breaking troubles, and has a superior noise-suppressing effect.

The noise suppression device of this invention comprises a toroid-shaped device comprising an amorphous magnetic alloy ribbon wound with plural turns, or ring-shaped pieces formed from an amorphous magnetic alloy ribbon and laminated in plural number, and a through-hole through which an electrical line or bead is inserted, and having a value of Do satisfying the relation of $L<Do<5L$, when an average diameter of said device is assumed as Do, provided that the average diameter is an arithmetic mean value of the outer diameter of the device and the diameter of the through-hole, and the largest length at a cross section of said line or said lead, is L, provided that L is smaller than the diameter of the through-hole.

DESCRIPTION OF THE PREFERRED EMBODIMENTS

Figure 1:
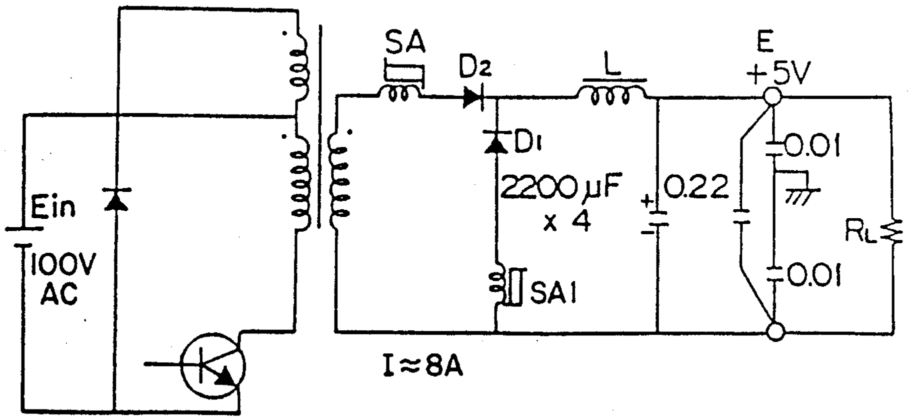
FIG. 1 is a diagram of a circuit for evaluation of conduction noise.

First, the amorphous magnetic alloy ribbon used in preparing the device of this invention may include, for example, alloys having the composition represented by the formula:

$$(M_{1-a}M'_{a})_{100-b}Y_{b} \quad (I)$$

wherein M represents at least one element selected from the group consisting of Fe and Co; M' represents at least one element selected from the group consisting of Ti, V, Cr, Mn, Ni, Cu, Zr, Nb, Mo, Ta and W; Y represents at least one element selected from the group consisting of B, Si, C and P; and a and b represent numbers satisfying $0 \leqq a \leqq 0.15$ and $10 \leqq b \leqq 35$, respectively.

Of these alloys, preferred are Co-based amorphous magnetic alloys having a saturation magnetostriction of $3\times10^{-6}$ or less, more preferably $1\times10^{-6}$ or less, as an absolute value, and advantageous are alloys represented by the formula:

$$(Co_{1-x-y}Fe_{x}M'_{y})_{100-z}Y_{z} \quad (II)$$

wherein M' and Y each have the same meaning as in the formula (I), and x, y and z represent numbers satisfying the relation of $0.01 \leqq x \leqq 0.1$, $0 \leqq y \leqq 0.1$ and $10 \leqq z \leqq 32$, respectively.

More preferred alloys may include alloys represented by the formula:

$$(Co_{1-c-d}Fe_{c}M''_{d})_{100-f}(Si_{1-e}B_{e})_{f} \quad (III)$$

wherein M'' represents at least one element selected from the group consisting of V, Cr, Mn, Ni, Cu, Nb and Mo; and c, d, e and f represent numbers satisfying $0.01 \leqq c \leqq 0.08$, $0 \leqq d \leqq 0.10$, $0.2 \leqq e \leqq 0.5$ and $20 \leqq f \leqq 30$, respectively.

In these alloys, M, M' and M'' all are elements effective for improving magnetic characteristics and improving its thermal stability, and alloys containing M' in excess of 15 atom % may result in a lowering of the Curie point and saturated magnetic flux density thereof. Also, Y is an element essential for making alloys amorphous, but alloys containing it in an amount less than 10 atom % or more than 35 atom % may result in difficulty in making alloys amorphous. Among Y, preferred from the viewpoint of thermal stability is the combination of Si with B as shown in formula (III). It is especially preferred from the viewpoints of thermal stability and coersive force that Si is contained in a larger amount than B.

The ribbon made of any of these alloys can be readily prepared in the shape of a ribbon with any desired composition, according to the method conventionally used, by rapidly quenching from the melt. It may also be subjected to suitable heat treatment at a temperature lower than the crystallization temperature, thereby enabling improvement in various properties.

The noise suppression device of this invention takes the form of a toroid having a through-hole in its center, and a line in semiconductor circuits or a lead of all sorts of devices such as rectifiers and capacitors is inserted through this through-hole to put it in practical use. In other words, the device is externally fitted by inserting the above line or lead through the through-hole. Accordingly, the through-hole is required to have the diameter such that the above line or lead can be inserted through the hole.

In the device of this invention, the average diameter (Do) refers to an arithmetic mean value of the outer diameter of the resulting core and the inner diameter thereof (i.e., diameter of the through-hole) when the above ribbon is wound in the toroidal shape. In this invention, the largest length (L) at a cross section of the line or lead refers to the diameter of a circle when, for example, the cross section of the line or lead is circular, and refers to the length at a diagonal when the cross section of the line or lead is rectangular. The value must be smaller than the diameter of the through-hole as a matter of course.

The device of this invention is characterized by designing its Do so that $L < Do \leqq 5L$, with respect to L of the line or lead to be inserted.

$Do \leqq L$ results in impossibility of inserting the line or lead through the through-hole of the device, and $Do \geqq 5L$ may result in a lowering of the noise-suppressing effect. Preferably, $1.1L \leqq Do \leqq 4.0L$. Most preferably, $1.1L \leqq Do \leqq 2.0L$.

The device of this invention is prepared by winding the above ribbon or laminating ring-shaped pieces formed from the ribbon. In the instance where, for example, it is prepared by winding, first a bobbin having a larger diameter than the value L of the line or lead to be inserted through the through-hole is prepared as a core material, and the above ribbon is wound on this core material with a given number of turns. The winding is stopped when the ribbon has been wound to the thickness that satisfies the average diameter Do having been set in relation to L, and the bobbin is removed after steps are taken so that the ribbon will not to be unwound. Thus, there is obtained at the center a core of toroidal shape, having a through-hole that has the same diameter with the diameter of the bobbin and has a given average diameter Do. This core is then subjected to coating on its outer periphery by electrostatic coating, thus obtaining the device of this invention.

In the instance where it is obtained by laminating, ring-shaped pieces with a given size may be punched out from the ribbon, an appropriate number of the ring-shaped pieces may be laminated, and subjecting the resulting laminate subjected to resin-coating treatment. Here, the hollow center formed by the ring-shaped pieces serves as the through-hole. In both instances, these devices do not receive any further winding of wire thereon.

The device of this invention is used in the following manner. Namely, a line in semiconductor circuits or a lead that is a lead out of various devices such as rectifiers or capacitors is inserted through the through-hole of the device of this invention. In other words, the device is externally fitted by inserting the above line or lead through the through-hole.

In this invention, the ribbon may be wound, or ring-shaped pieces formed from the ribbon may be laminated, to give a thickness usually of less than 1.5 mm, preferably not more than 1.3 mm, and more preferably not more than 1.1 mm. In the case where the device comprises laminated ring-shaped pieces, the "thickness"

mentioned above refers to a distance from the inner periphery of the ring to the outer periphery thereof.

A preferred embodiment of this invention will be described below. In the noise suppression device of this invention, assuming the thickness given by the wound ribbon or laminated ring-shaped pieces of the ribbon as D, and the height thereof as H, D and H may preferably be in the relation satisfying the formula: $0.03 \leq D/H \leq 0.3$.

A method of preparing the noise suppression device of this invention according to the above preferred embodiment will be described below. In the instance where, for example, it is prepared by winding, a bobbin having a given diameter is used as a core material, and the ribbon is wound on this core material with a given number of turns. The winding of the ribbon is stopped when the thickness (D) given by the wound ribbon has come to have the thickness satisfying the relation, described below, to the width of the ribbon (this width corresponds to the height (H) of the device in a device on which the winding has been applied), and the bobbin is removed after steps are taken so that the ribbon will not to be unwound. Thus, there is obtained a core of toroidal shape, having at the center a through-hole that has the same diameter with the diameter of the bobbin and has a height corresponding itself to the width of the ribbon. This core is then subjected to coating on its outer periphery by electrostatic coating, thus obtaining the device of this invention.

Here, D and H are required to satisfy the relation of $0.03 \leq D/H \leq 0.3$. The value of D/H smaller than 0.03 may result in a small noise suppression ability of the resulting device, and the value of D/H more than 0.3 may cause a lowering of the heat-dissipation properties of the device to make it impossible to disregard the temperature rise of the device at the time of operation. Preferably, D and H may be in such a size that D/H comes to be a value of from 0.05 to 0.25. In regard to H, it may preferably be not more than 8 mm.

In another preferred embodiment of this invention, a ribbon having a surface roughness $R_f$ of not less than 0.2 and not more than 0.8 is used as the above amorphous magnetic alloy ribbon. Here, $R_f$ is a parameter characterizing the roughness determined by $R_f = R_z/T$ when the ten point average roughness in the standard length of 1.5 mm as prescribed in JIS B0601 and an average sheet thickness determined from the weight of the ribbon are assumed as $R_z$ and T, respectively. The ten-point mean roughness is the value of difference, expressed in micrometer (μm), between the mean value of altitudes of peaks from the highest to the 5th, measured in the direction of vertical magnification from a straight line that is parallel to the mean line and that does not intersect the profile, and the mean value of altitudes of valleys from the deepest to the 5th, within a sampled portion, of which length corresponds to the reference length, from the profile.

Figure 7:
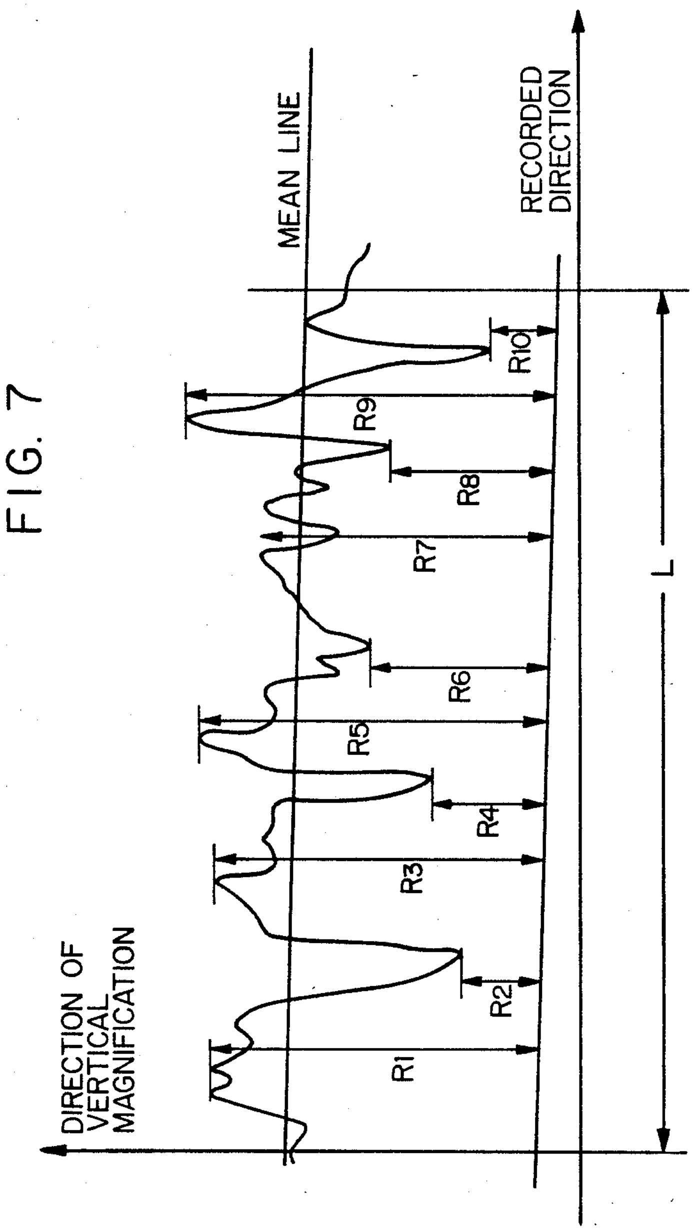
FIG. 7, explains the calculation of ten-point mean surface roughness.

An example of determination of the ten-point mean roughness is shown in FIG. 7 where L is the reference length, and $$R_2 = \frac{(R_1 + R_3 + R_5 + R_7 + R_9) - (R_2 + R_4 + R_6 + R_8 + R_{10})}{5}$$

Otherwise $R_f$ otherwise less than 0.2 may result in good adhesion between layers in winding, which causes stress, resulting in deterioration of magnetic properties and decreasing the noise suppression effect. $R_f$ larger than 0.8 increases the gap between layers of the magnetic core, resulting in a small total magnetic flux quantity and decreasing the noise suppression effect.

As a means for bringing the ribbon surface roughness into the scope of this invention, it is necessary to control preparation conditions such as roll materials, surface temperatures of the roll and ejection temperature of molten metal.

The device of this invention can be put into practical use by merely externally fitting it on a line or a lead as described above, but, in embodiments of its use, when it is applied, for example, to a lead of rectifiers or capacitors, not only may the device be externally fitted by inserting the lead through the through-hole, but also the device of this invention and the lead may be integrally formed by molding using an electrically insulating synthetic resin. More specifically, various devices in which the device of this invention has been externally fitted may, for example, be placed in a given mold or case, and a resin such as epoxy resin or silicone resin cast therein to make a molding. Alternatively, it may be placed in a protective cover or fixed frame made of a molding resin such as Teflon and phenol.

Holding the device of this invention and the various devices in an integrated form in this manner makes it possible to prevent the device of this invention from coming off the lead when these various devices are handled, and, also when the various devices are incorporated into semiconductor circuit boards, it makes it possible to mechanize the operation of incorporating them.

The device of this invention may particularly preferably be applied to leads of diodes and capacitors. In particular, in the instance of diodes, external noise is generated when an abrupt change in electric current is caused in the diodes, but the device of this invention can suppress it, desirably. Also, in the instance of capacitors, combination with the device of this invention can constitute a noise filter with ease to provide a countermeasure to noise, desirably.

EXAMPLE 1

A Co-based amorphous magnetic alloy ribbon having a thickness of 15 μm, a width of 5 mm and the composition of $(Co_{0.94}Fe_{0.05}Nb_{0.01})_{72}Si_{15}B_{13}$ was wound with varied number of turns to prepare toroid-shaped cores having different average diameter values. The outer surfaces of these cores were coated with epoxy resin.

In a conduction noise evaluation circuit as shown in FIG. 1, these devices were used such that a device SA1 was externally fitted on a line, or on a lead of a diode D1. In the instance of a line, the line on which SA1 was externally fitted through its through-hole was comprised of a wire having a diameter of 2 mm (L=2), and, in the instance of a diode, the lead of the diode D1 was flat and rectangular in its cross section, which cross section had a largest length (L) of 1.6 mm.

Figure 2:
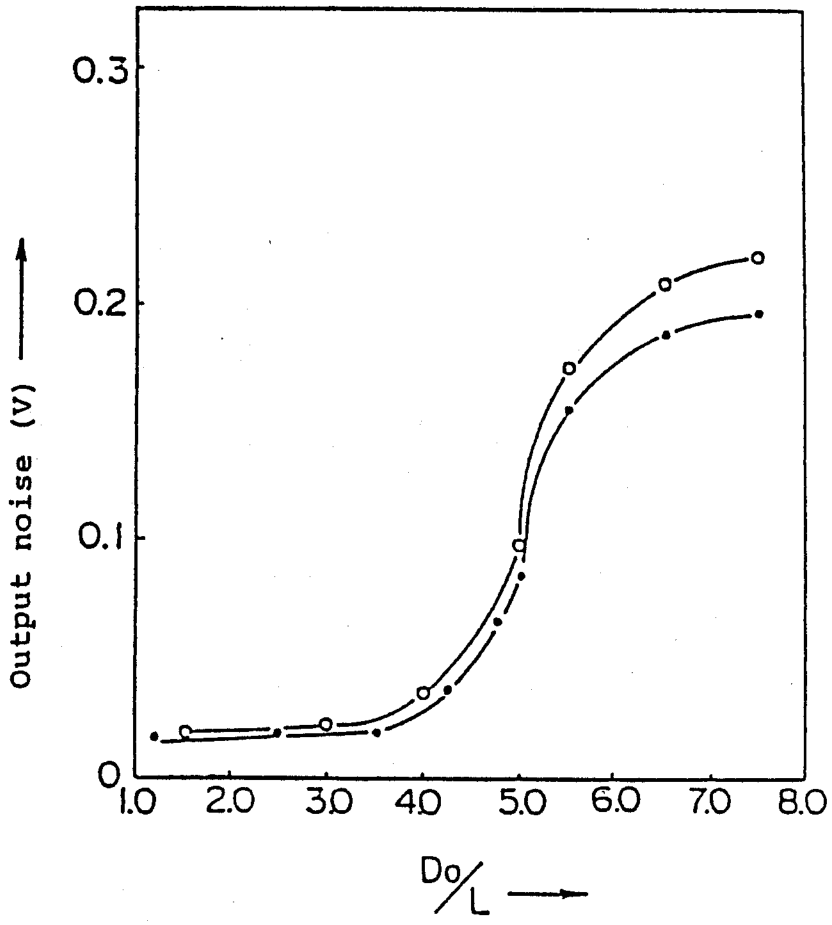
FIG. 2 is a graph showing the relation between an output noise and a Do/L value when a device having a different Do/L value is incorporated as SA1 in the circuit of FIG. 1.

In each case, output noise from the circuit was measured under the test conditions of input voltage Ein: AC 100 V, output voltage E: DC 5 V, output current I:≃8 A, operation frequency f: 200 kHz and L: CY choke, 40 μF - 10 A. Results obtained are shown in FIG. 2 as the relation of Do/L. In the figure, the mark -o- indicates the results obtained when the device was inserted to the line, and the mark -●-, when inserted to the lead.

EXAMPLE 2

A Co-based amorphous magnetic alloy ribbon having a thickness of 15 $\mu m$, a width of 4 mm and the composition of $(Co_{0.94}Fe_{0.05}Nb_{0.01})_{72}Si_{15}B_{13}$ was wound to prepare devices of this invention, each having an outer diameter of 4 mm, an inner diameter (i.e., diameter of the through-hole) of 2 mm, and a height of 4 mm. The outer surfaces of these cores are coated with epoxy resin.

Figure 3A:
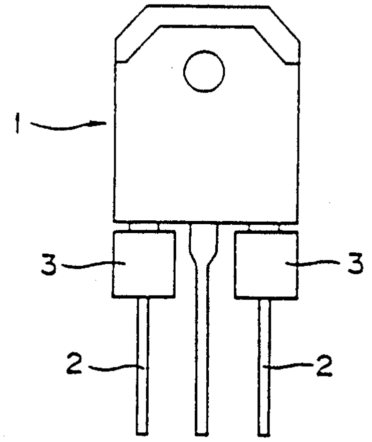
FIG. 3(*a*) and FIG. 3(*b*) are views illustrating a rectifier on which the devices of this invention have been externally fitted, of which FIG. 3(*a*) is a front view and FIG. 3(*b*) is a side view.
Figure 3B:
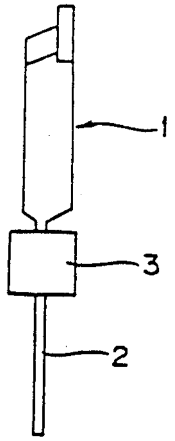
Figure 4A:
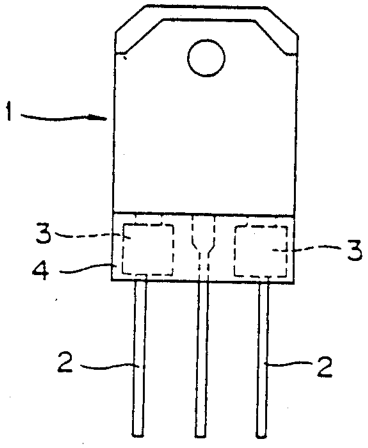
FIG. 4(*a*) and FIG. 4(*b*) are views illustrating a state in which the devices of this invention and leads of a rectifier have been integrally formed by molding, of which FIG. 4(*a*) is a front view and FIG. 4(*b*) is a side view.
Figure 4B:
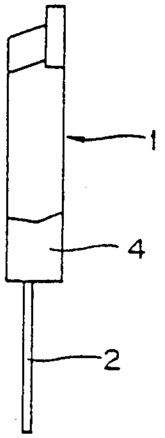

Using a TO3P type diode 1 comprising two pieces of diodes integrally formed in one package as illustrated in FIG. 3(*a*) and FIG. 3(*b*), the above devices 3, 3 of this invention was fitted on two leads 2, 2 among three leads of the diode to prepare a diode fitted with inductors. The leads of the diode were rectangular in their cross sections which were 0.5 mm long and 1.6 mm broad and had a largest (diagonal) length (L), found by calculation, of about 1.68 mm. As another example, as illustrated in FIG. 4(*a*) and FIG. 4(*b*), the devices 3, 3 of this invention were fitted on leads 2, 2 of the diode 1, and thereafter the parts to which they were fitted were formed by molding using epoxy resin 4 to bring both into an integral form.

For comparison, on the other hand, ferrite beads comprising Mn-Zn ferrite and having the same dimension were fitted to a similar diode to prepare a diode fitted with inductors having the same shapes as in the above example of FIG. 3(*a*) and FIG. 3(*b*).

The three types of diodes according to the above examples and comparative example were each set on the secondary side of a switching electric source that employs a forward system of 200 kHz. Then, the temperature difference $\Delta T$ (°C) between the outer periphery of inductors and the inner periphery thereof fitted on the leads, that causes the breakage of inductors, was measured at the time when a voltage rises (at the start of use). Results obtained are shown in Table 1. Temperature in a steady state was also shown similarly in Table 1 as a reference. Environmental temperature was kept constant at 20 C.

TABLE 1

| | Temperature difference Δ T at voltage rise (°C.) | Temperature in a steady state (°C.) |
|---|---|---|
| Example 2 | 3 | 30 |
| Comparative example | 9 | 38 |

Also prepared were 100 pieces of samples, respectively in which the three types of diodes were each set on the secondary side of a switching electric source, and durability tests were carried out during intermittent use of these under the same conditions over a period of one month. As a result, no break of inductors was seen in the two types of the diodes according to this invention, but, in contrast therewith, breaks of 8 inductors were seen among 100 pieces of the diodes fitted with the ferrite beads.

Next, using as the diode D1 in the conduction noise evaluation circuit shown in FIG. 1 a diode in which the devices of this invention were fitted on its lead and line, output noise from the circuit was measured under the test conditions of input voltage Ein: AC 100 V, output voltage E: DC 5 V, output current I: ≈8 A, operation frequency f: 200 kHz and L: CY choke, 40 $\mu F$ - 10 A. The values obtained were 0.05 V in each instance.

With a diode in which the conventional ferrite bead was fitted on its lead as D1, the output noise was 0.15 V. Radiation noise generated by both diodes was further measured using two frequencies of 120 MHz and 30 MHz. Results obtained are shown in Table 2.

TABLE 2

| | Radiation noise (dB) (120 MHz) | Radiation noise (dB) (30 MHz) |
|---|---|---|
| Example 2 | 80 | 100 |
| Comparative example | 115 | 128 |

EXAMPLE 3

A Co-based amorphous magnetic alloy ribbon having a thickness of 15 $\mu m$, a width of 4 mm and the composition of $(Co_{0.94}Fe_{0.05}Nb_{0.01})_{72}Si_{15}B_{13}$ was wound with varied number of turns to prepare toroid-shaped cores having different D values. The cores each had a size of 2 mm in inner diameter, 1 mm in thickness D given by the wound ribbon, and 4 mm in height L. The outer surfaces of these cores were coated with epoxy resin.

Figure 5:
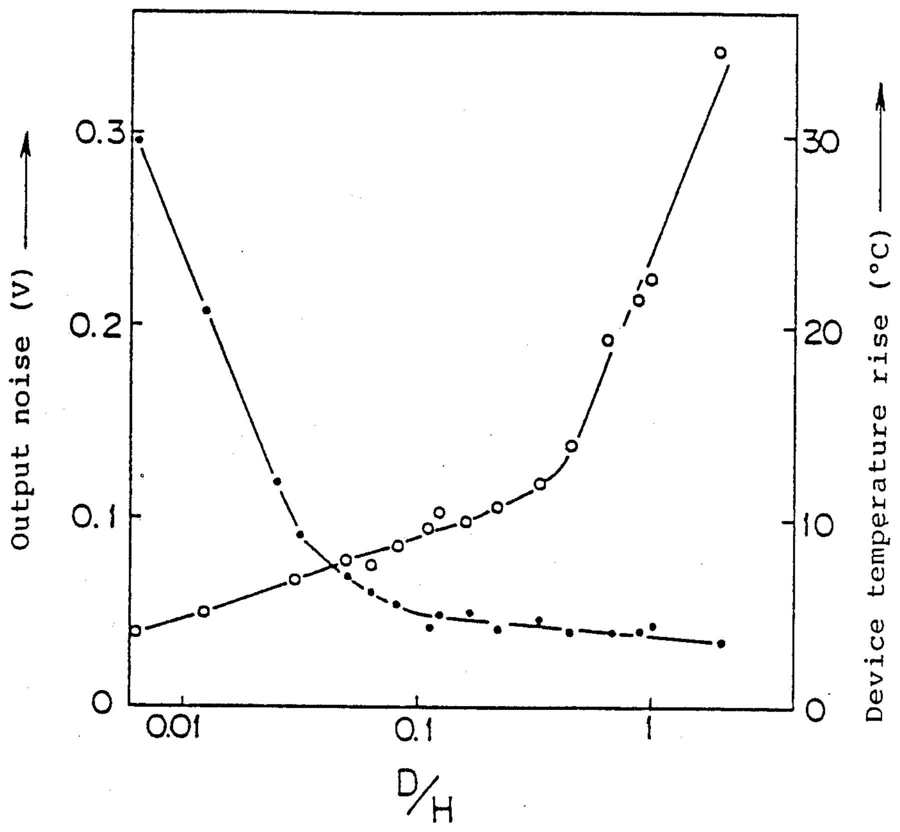
FIG. 5 is a graph showing how the temperature rise at the time of operation of devices each having a different D/H and the output noise from a circuit relate to D/H.
Figure 6A:
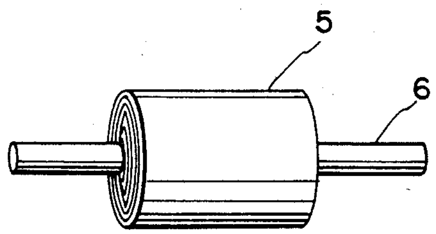
FIGS. 6a and 6b are schematic views of the devices of this invention.
Figure 6B:
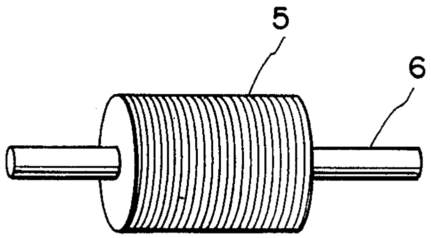

In a conduction noise evaluation circuit as shown in FIG. 1, these devices were used such that a device SA1 was externally fitted on a line, or on a lead of a diode D1. In each case, output noise from the circuit was measured under the test conditions of input voltage Ein: AC 100 V, output voltage E: DC 5 V, output current I: ≈8 A, operation frequency f: 200 kHz and L: CY choke, 40 $\mu F$ - 10 A. The leads of the diode were rectangular in their cross sections which were 0.5 mm long and 1.6 mm broad, the largest length (L) being found by calculation to be about 1.68 mm. Results obtained are shown in FIG. 5 as the relation of D/H. In the figure, the mark -●- indicates output noise, and the mark -o-, temperature rise of device, and each value is expressed as an average value in each D/H.

As will be clear from FIG. 5, when D/H is 0.03 or more the output noise of the circuit is suppressed to a level which is of no problem in practical use, and when it is 0.3 or less the temperature rise of the device comes to be 12° C. or less which is of no problem in practical use.

EXAMPLE 4

A Co-based amorphous magnetic alloy ribbon having a thickness of 15 $\mu m$, a width of 4 mm, a surface roughness of $R_f=0.52$ and the composition of $(Co_{0.94}Fe_{0.05}Nb_{0.01})_{72}Si_{15}B_{13}$ was wound to prepare 1,000 pieces of the device of this invention, each having an outer diameter of 4 mm, an inner diameter (i.e., diameter of the through-hole) of 2 mm, and a height of 4 mm. The outer surfaces of these devices were coated with epoxy resin. A schematic view of the device is illustrated in FIGS. **6*a* and 6*b* (in which the numeral 5 denotes a magnetic core; 6**, a lead wire).

For comparison, on the other hand, an amorphous alloy ribbon was prepared having the same alloy composition but Rf=0.11, and also prepared were 1,000 pieces of the device having the same shape.

For comparison, inductors comprising Mn-Zn ferrite and having the same shape as in Example 1 above were also prepared.

Lead wires were all rectangular in their cross sections, being 0.5 mm long and 1.6 mm broad, the largest length (L) was found by calculation to be about 1.68 mm. These magnetic cores were used at the position of SA1 in the conduction noise evaluation circuit illustrated in FIG. 1, and output noise from the circuit was measured under the test conditions of input voltage Ein: AC 100 V, output voltage E: DC 5 V, output current I: ≃8 A, operation frequency f: 200 kHz and L: CY choke, 40 μF - 10 A.

As a result, in examples of this invention, the output noise was stable and as low as 0.04 to 0.06 in all 1,000 pieces, but, in comparative examples in which the amorphous alloy ribbon of $R_f=0.11$ was used, only about 15% of the devices attained the output noise of the same level, and the remainder showed an output noise of from 0.12 to 0.15 V.

The comparative examples in which the ferrite was used showed an output noise of from 0.14 to 0.17 V.

As will be clear from the above description, the device of this invention, constituted of an alloy material, becomes substantially perfectly free of any breaking troubles, can be used over a long period of time, has superior heat-dissipation properties, and also has a superior effect on suppression of the conduction noise or radiation noise of a circuit. Moreover, it can be externally fitted on a lead of various devices, and hence it has a great industrial value when used as magnetic parts such as simple noise suppression devices and saturable reactors.

We claim:

1. A toroid-shaped noise suppression device comprising:

at least one member selected from the group consisting of plural windings of an amorphous magnetic alloy ribbon and a plurality of laminated ring-shaped pieces formed from an amorphous magnetic alloy ribbon, and said member having a circular through-hole adapted to receive one of an electrical line and a lead, a largest cross-sectional length of said line or lead being L, said ribbon and said through-hole forming a circular shaped device having an average diameter Do that is an arithmetic means value of the outer diameter of the device and the diameter of the through-hole, wherein $L<Do\leqq 5L$ and L is smaller than the diameter of the through-hole, said amorphous magnetic alloy ribbon comprising an amorphous magnetic alloy represented by the formula:

$$(M_{1-a}M'_a)_{100-b}Y_b \quad \text{(I)}$$

wherein M represents at least one element selected from the group consisting of Fe and Co; M' represents at least one element selected from the group consisting of Ti, V, Cr, Mn, Mi, Cu, Zr, Nb, Mo, Ta and W; Y represents at least one element selected from the group consisting of B, Si, C and P; and a and b represents numbers satisfying $0\leqq a\leqq 0.15$ and $10\leqq b\leqq 35$, respectively.

2. The noise suppression device according to claim 1, wherein said ribbon has a surface roughness $R_f$ of not less than 0.2 and not more than 0.8 wherein $R_f$ is a parameter characterizing the roughness determined by $R_f=R_z/T$ when the ten-point average roughness in the standard length of 2.5 mm as prescribed in JIS B0601 and an average sheet thickness determined from the weight of the ribbon are assumed as $R_z$ and T, respectively.

3. The noise suppression device according to claim 1, wherein said amorphous magnetic alloy ribbon comprises a ribbon of a Co-based amorphous magnetic alloy.

4. The noise suppression device according to claim 1, wherein said amorphous magnetic alloy ribbon comprises an amorphous magnetic alloy represented by the formula:

$$(Co_{1-x-y}Fe_xM'_y)_{100-z}Y_z \quad \text{(II)}$$

wherein M' and Y each have the same meaning as in the formula (I), and x, y and z represent numbers satisfying the relation of $0.01\leqq x\leqq 0.1$, $0\leqq y\leqq 0.1$ and $10\leqq z\leqq 32$, respectively.

5. The noise suppression device according to claim 1, wherein said amorphous magnetic alloy ribbon comprises an amorphous magnetic alloy represented by the formula:

$$(Co_{1-c-d}Fe_cM''_d)_{100-f}(Si_{1-e}B_e)_f \quad \text{(III)}$$

wherein M'' represents at least one element selected from the group consisting of v, Cr, Mn, Ni, Cu, Nb and Mo; and c, d, e and f represent numbers satisfying $0.01\leqq c\leqq 0.08$, $0\leqq d\leqq 0.10$, $0.2\leqq e\leqq 0.5$ and $20\leqq f\leqq 30$, respectively.

6. The noise suppression device according to claim 1, wherein the noise suppression device is applied to a lead of one of a rectifier and a capacitor.

7. The noise suppression device according to claim 1, wherein the noise suppression device is integrally molded to the lead or line.

8. The noise suppression device according to claim 1, wherein D is a thickness of the wound ribbon or a distance from the inner periphery to the outer periphery of the laminated ring-shaped pieces, H is the height of the device, and D and H are in the relation: $0.03\leqq D/H\leqq 0.3$.

* * * * *